(12) United States Patent
Darwish et al.

(10) Patent No.: US 9,385,227 B2
(45) Date of Patent: *Jul. 5, 2016

(54) POWER DEVICES, STRUCTURES, COMPONENTS, AND METHODS USING LATERAL DRIFT, FIXED NET CHARGE, AND SHIELD

(71) Applicant: MaxPower Semiconductor, Inc., Santa Clara, CA (US)

(72) Inventors: Mohamed N. Darwish, Campbell, CA (US); Jun Zeng, Torrance, CA (US)

(73) Assignee: MaxPower Semiconductor, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/027,873

(22) Filed: Sep. 16, 2013

(65) Prior Publication Data

US 2015/0076593 A1    Mar. 19, 2015

Related U.S. Application Data

(63) Continuation of application No. 12/835,636, filed on Jul. 13, 2010, now Pat. No. 8,564,057, which is a continuation-in-part of application No. 12/432,917, filed on Apr. 30, 2009, now Pat. No. 8,330,186, said application No. 12/835,636 is a continuation-in-part of application No. 12/431,005, filed on Apr. 28, 2009.

(60) Provisional application No. 61/225,009, filed on Jul. 13, 2009, provisional application No. 61/084,639, filed on Jul. 30, 2008, provisional application No. 61/084,642, filed on Jul. 30, 2008.

(51) Int. Cl.
*H01L 29/66* (2006.01)
*H01L 29/78* (2006.01)

(52) U.S. Cl.
CPC ........ *H01L 29/7813* (2013.01); *H01L 29/7816* (2013.01)

(58) Field of Classification Search
CPC . H01L 29/0696; H01L 29/49; H01L 29/6659; H01L 29/7813; H01L 29/66325; H01L 29/66333; H01L 29/7393; H01L 2924/13055; H01L 29/7816
USPC ......... 257/288, 368, 369, 330, 378, 477, 565, 257/557; 438/151, 197, 199, 270, 309, 322
See application file for complete search history.

(56) References Cited

U.S. PATENT DOCUMENTS

| | | | | |
|---|---|---|---|---|
| 5,898,198 A | * | 4/1999 | Herbert | H01L 23/552 257/319 |
| 2002/0123196 A1 | * | 9/2002 | Chang | H01L 21/28167 438/270 |
| 2003/0047792 A1 | * | 3/2003 | Disney | H01L 29/402 257/488 |
| 2009/0273026 A1 | * | 11/2009 | Wilson | H01L 29/407 257/330 |

* cited by examiner

*Primary Examiner* — Jarrett Stark
*Assistant Examiner* — Shahed Ahmed
(74) *Attorney, Agent, or Firm* — Groover & Associates PLLC; Robert Groover; Gwendolyn Groover

(57) ABSTRACT

Lateral power devices where immobile electrostatic charge is emplaced in dielectric material adjoining the drift region. A shield gate is interposed between the gate electrode and the drain, to reduce the Miller charge. In some embodiments the gate electrode is a trench gate, and in such cases the shield electrode too is preferably vertically extended.

16 Claims, 23 Drawing Sheets

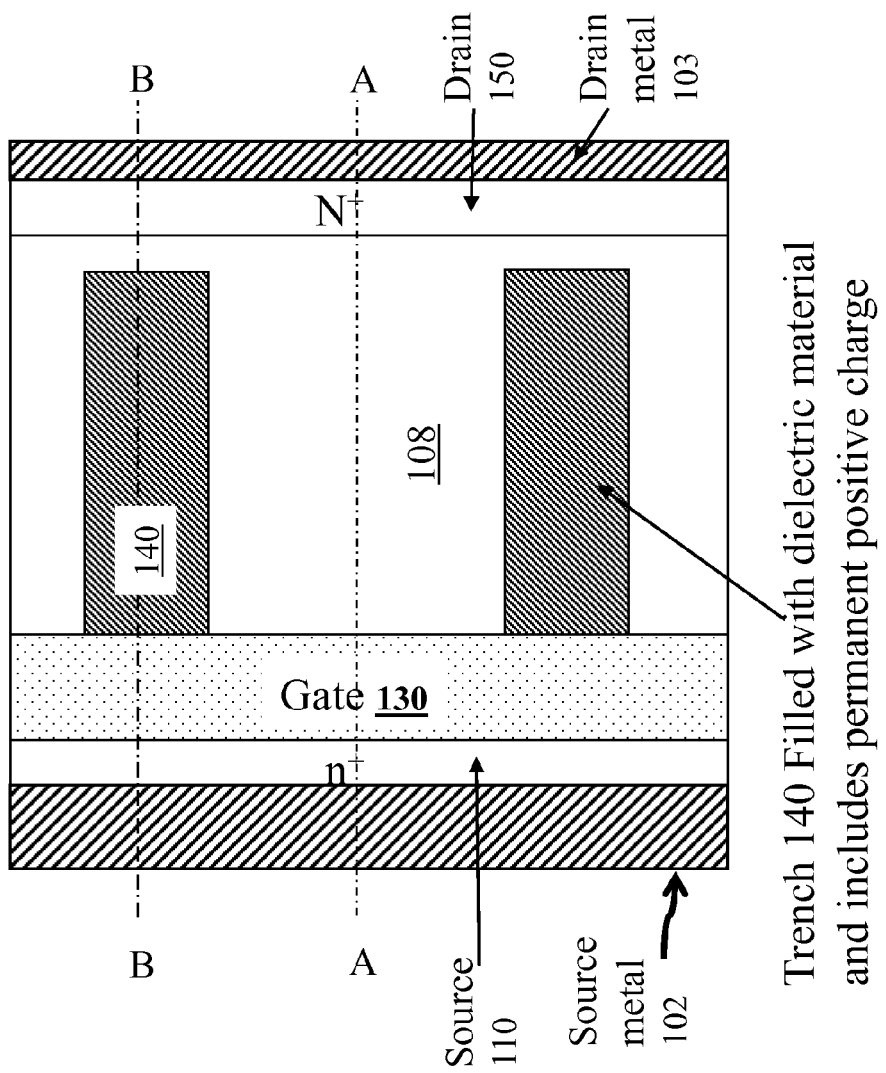
Figure 1(a): Top view of previously proposed lateral power FET structure

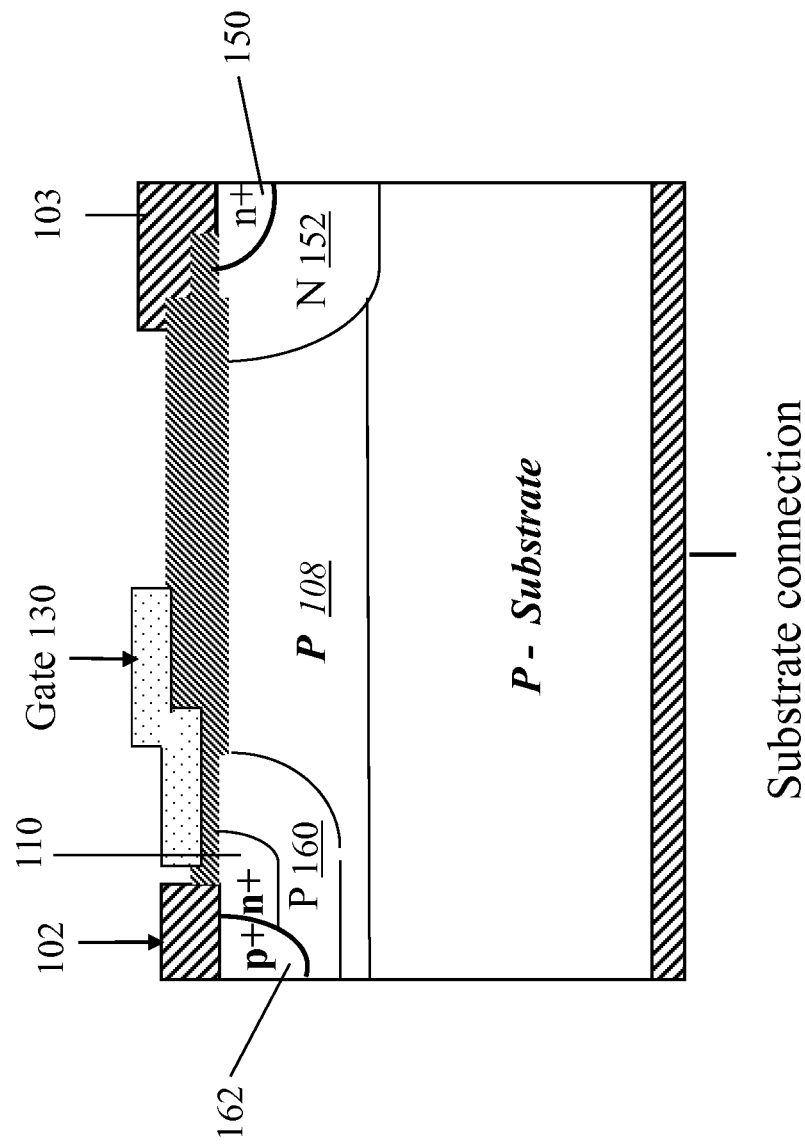
Figure 1(b): A cross section along AA

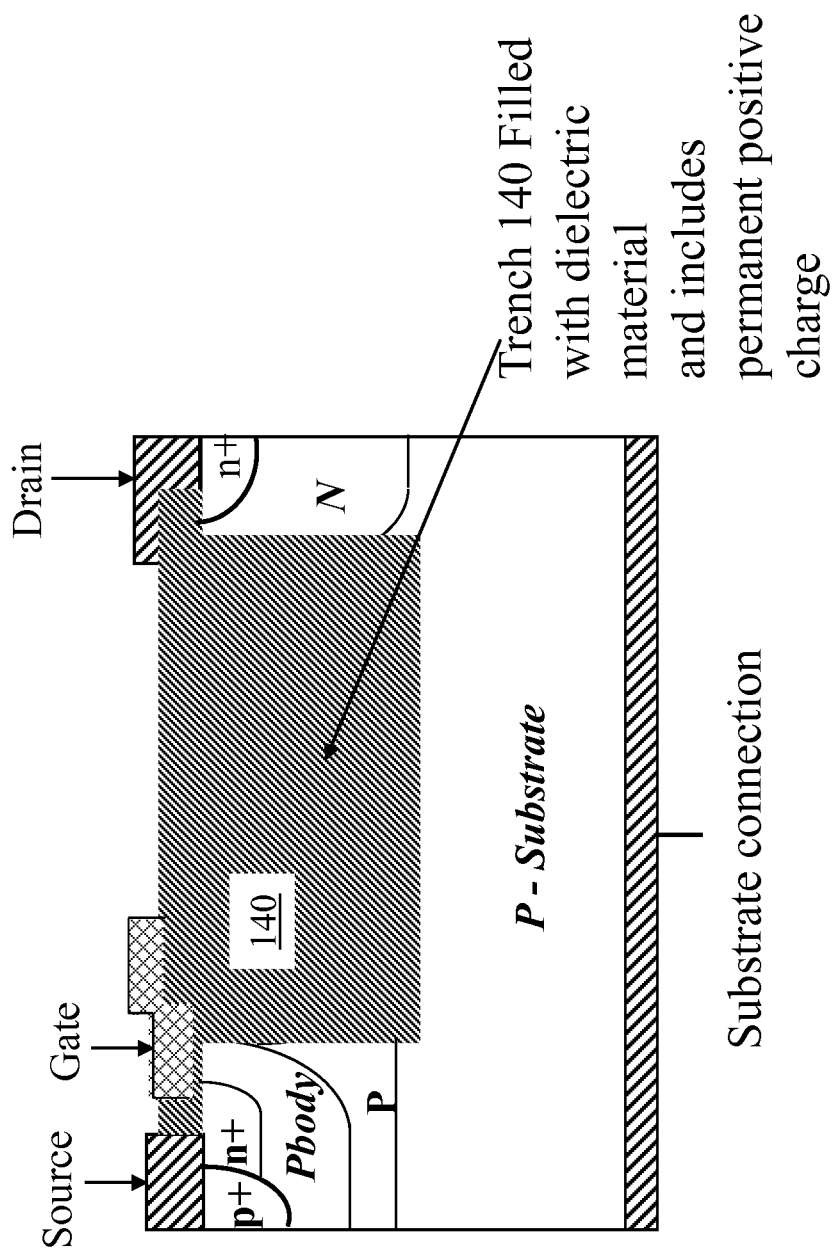
Figure 1(c): Section along BB

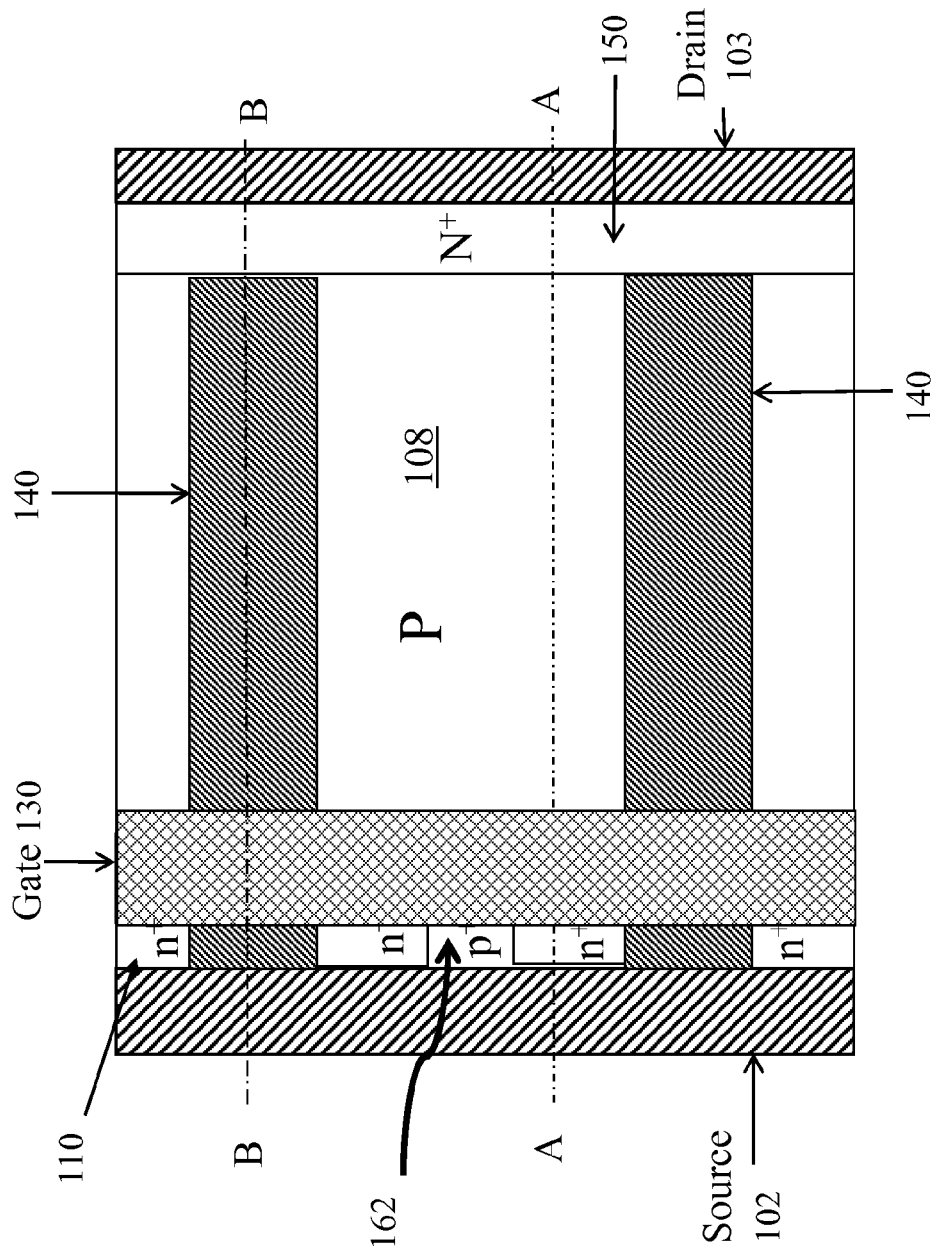
Figure 2(a): Alternative source pattern

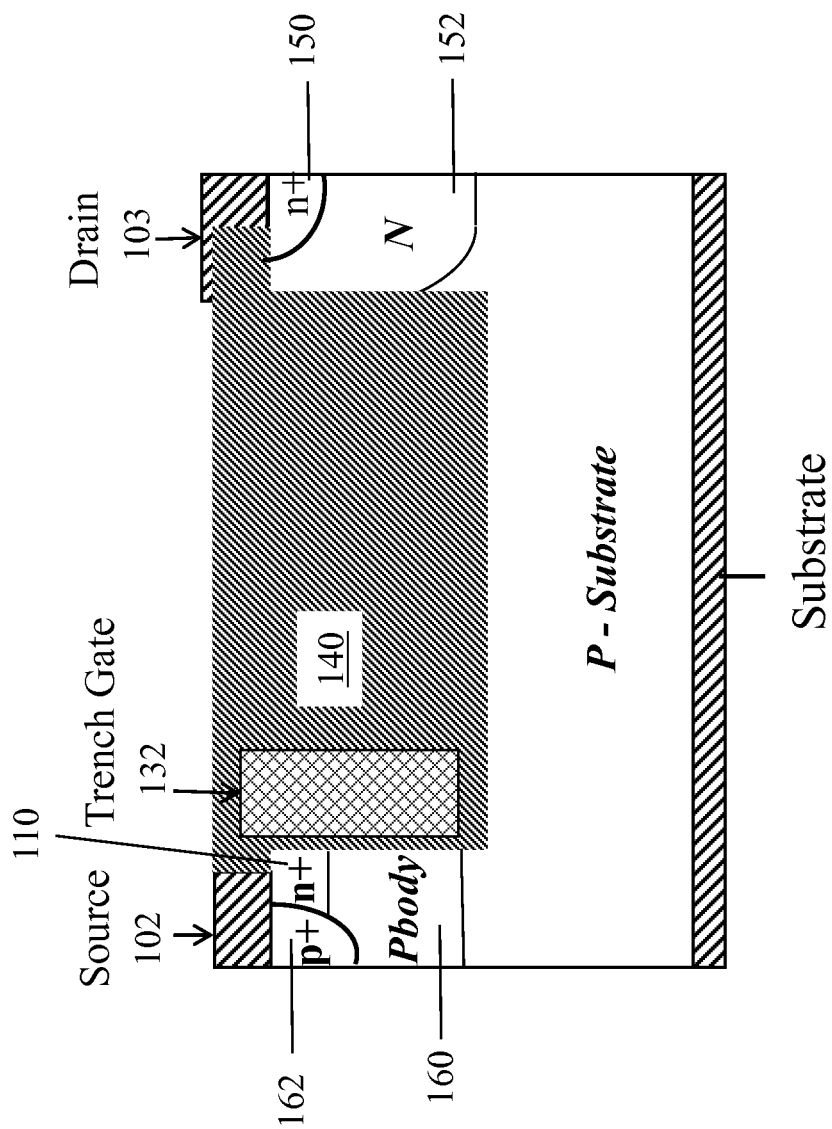
Figure 2(b): Another embodiment: cross section along BB of Figure 1(a).

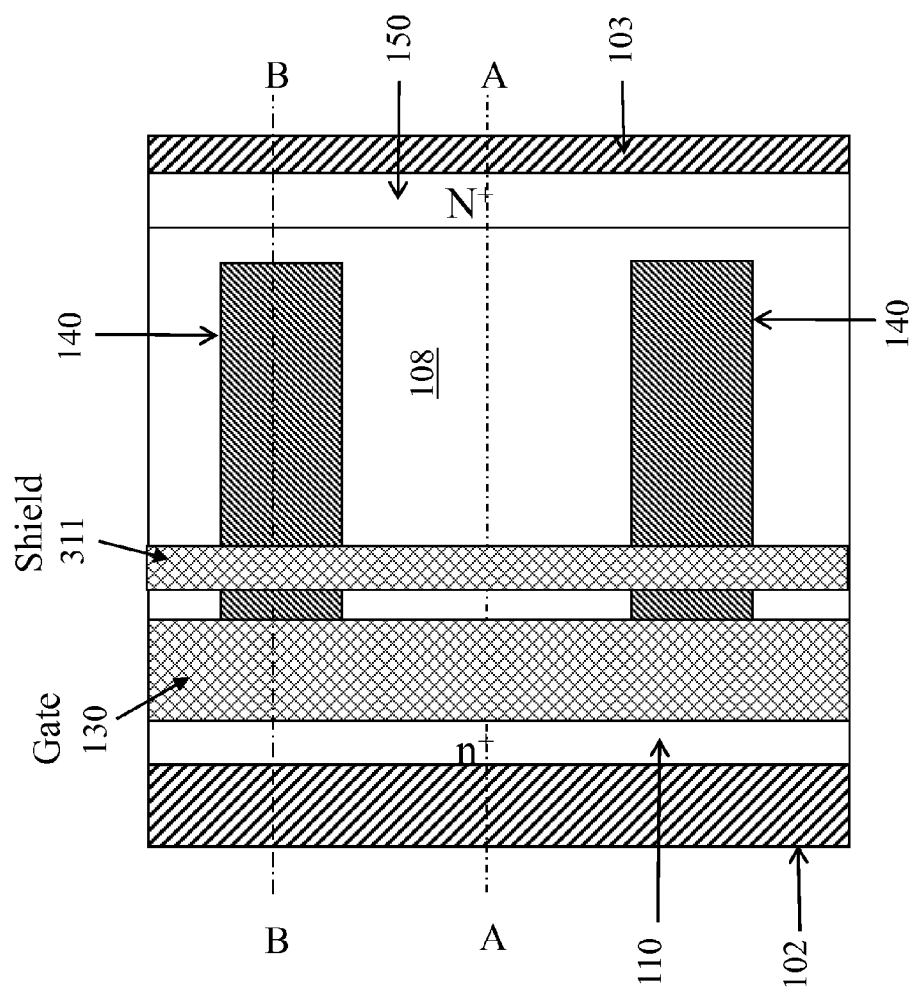
Figure 3(a): Top view of newest improvement to lateral power MOSFET structures

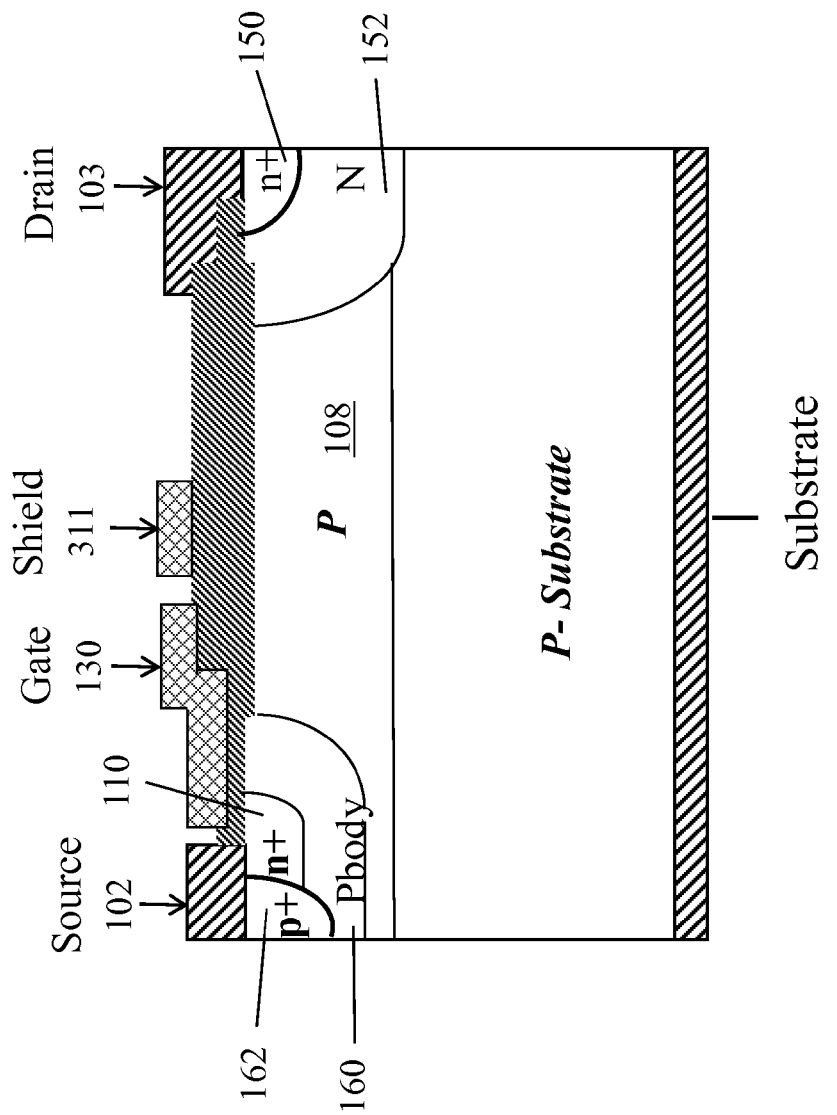
Figure 3(b): A cross section along AA

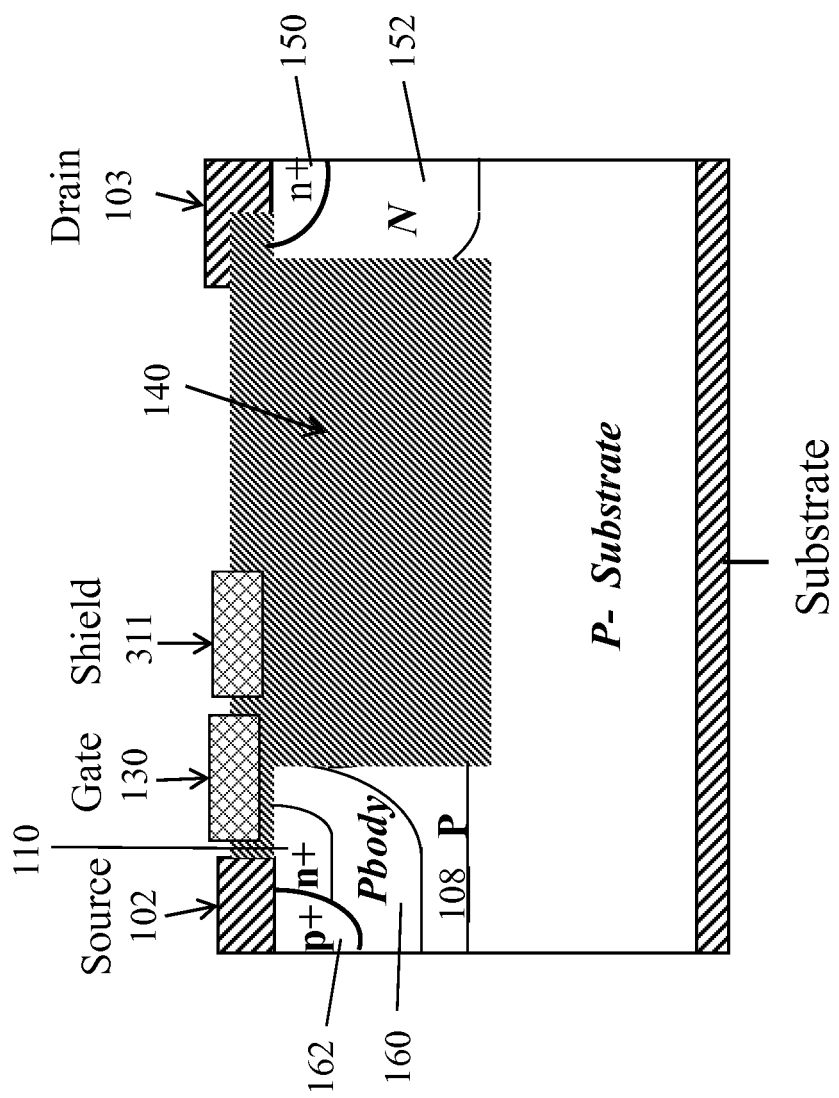
Figure 3(c): Another version: cross section along BB

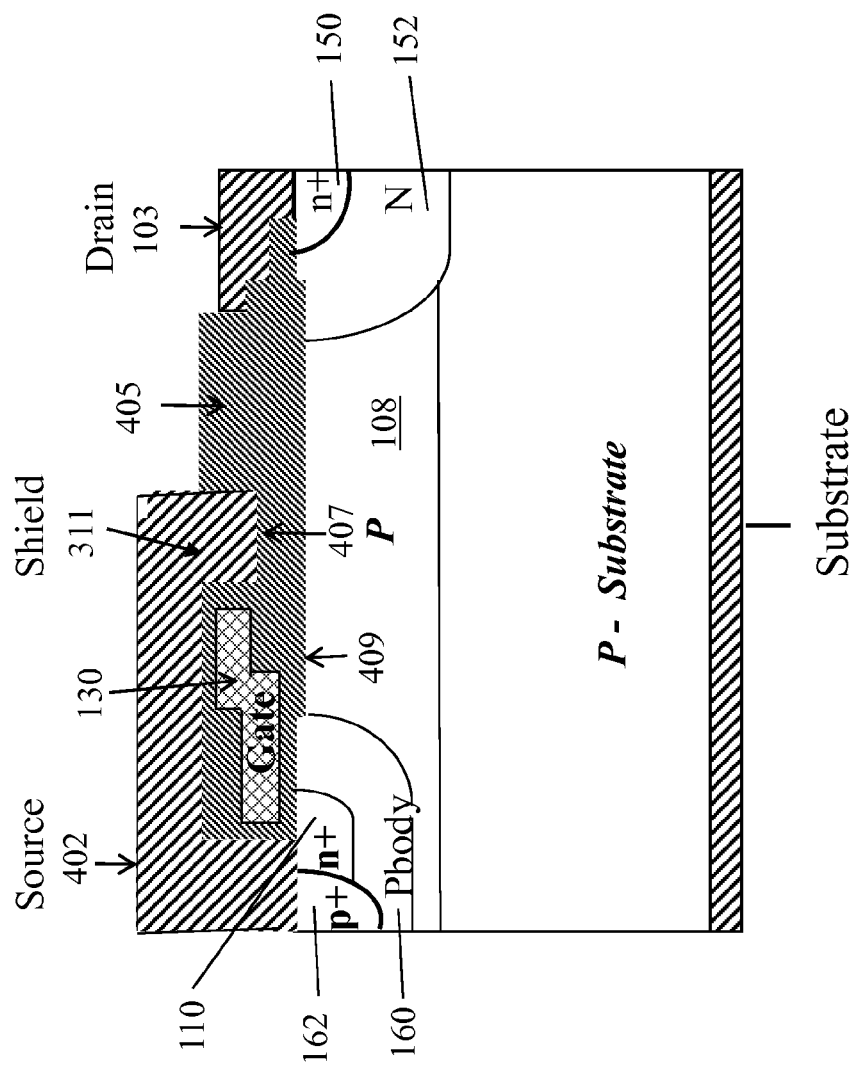
Figure 4: Shield layer using source metal

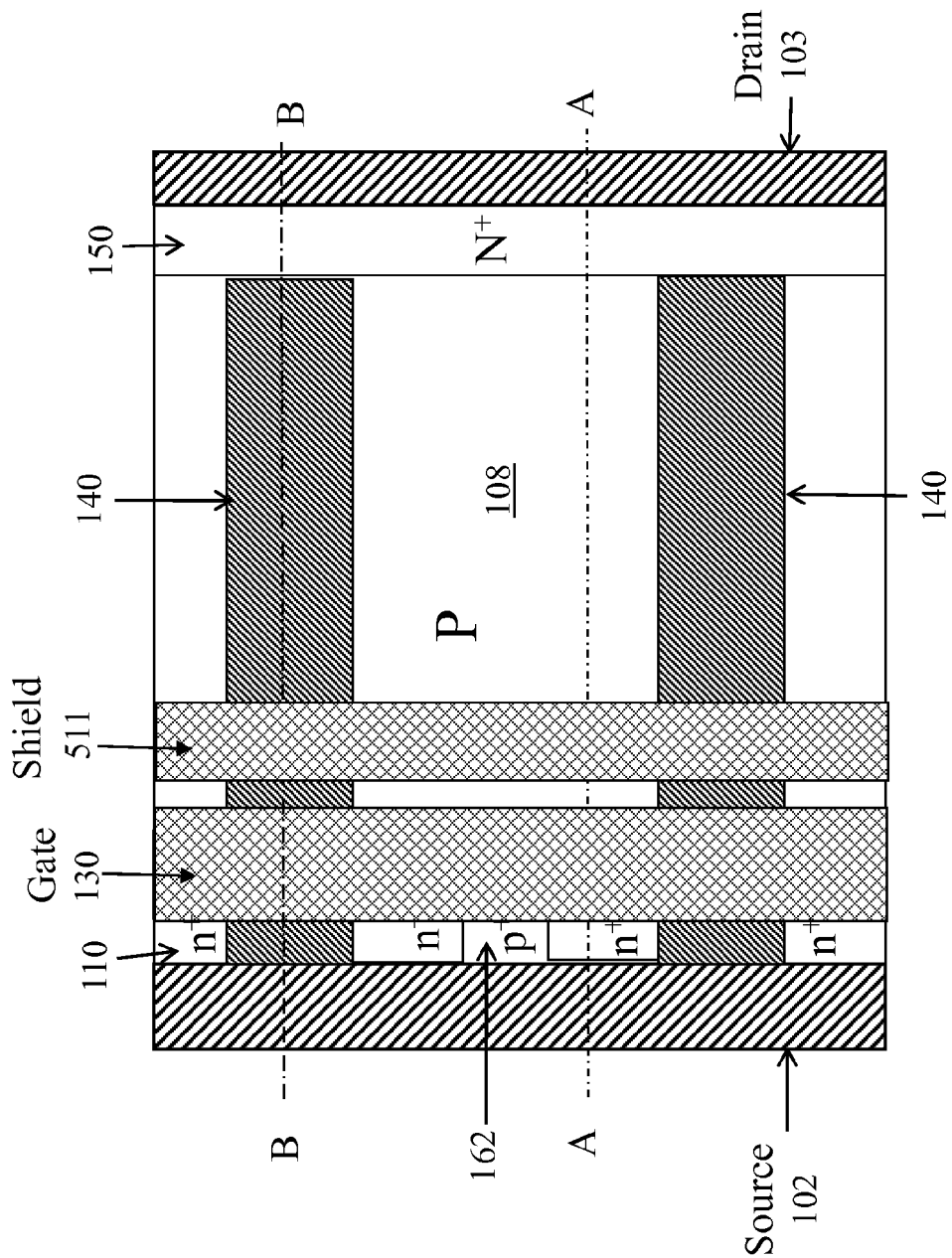
Figure 5(a): Top view of new lateral power MOSFET structure

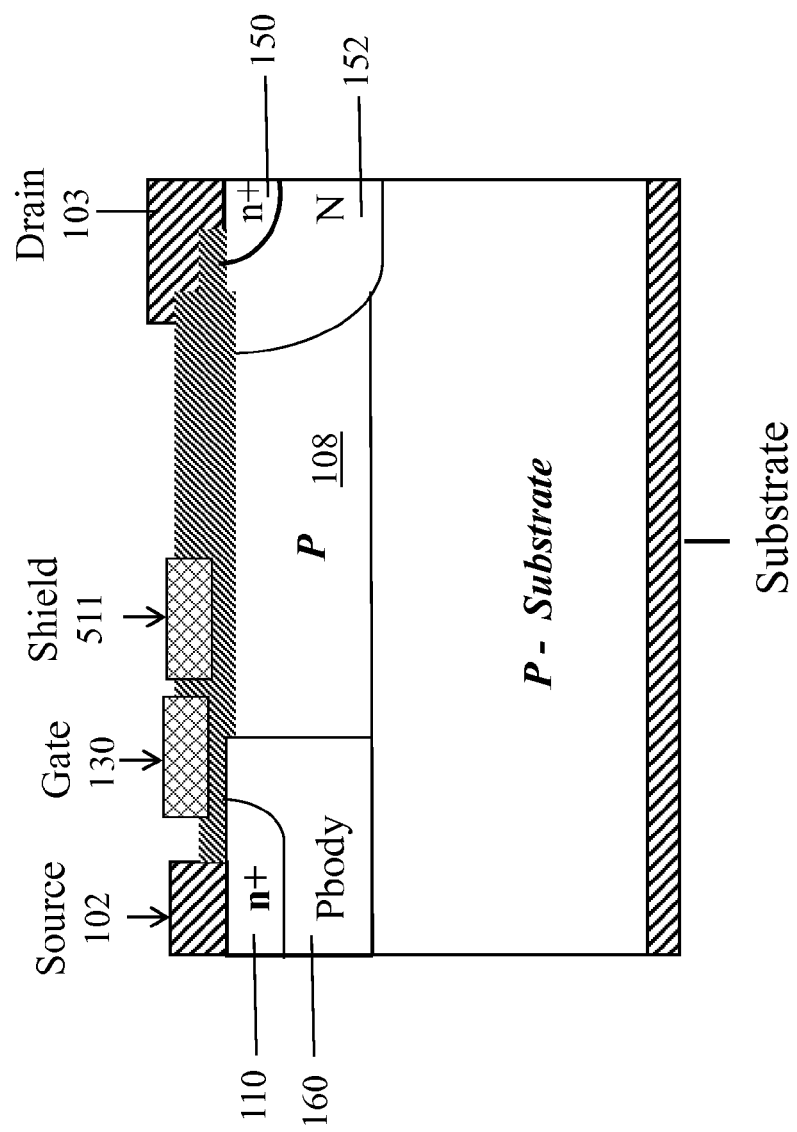
Figure 5(b): A cross section along AA

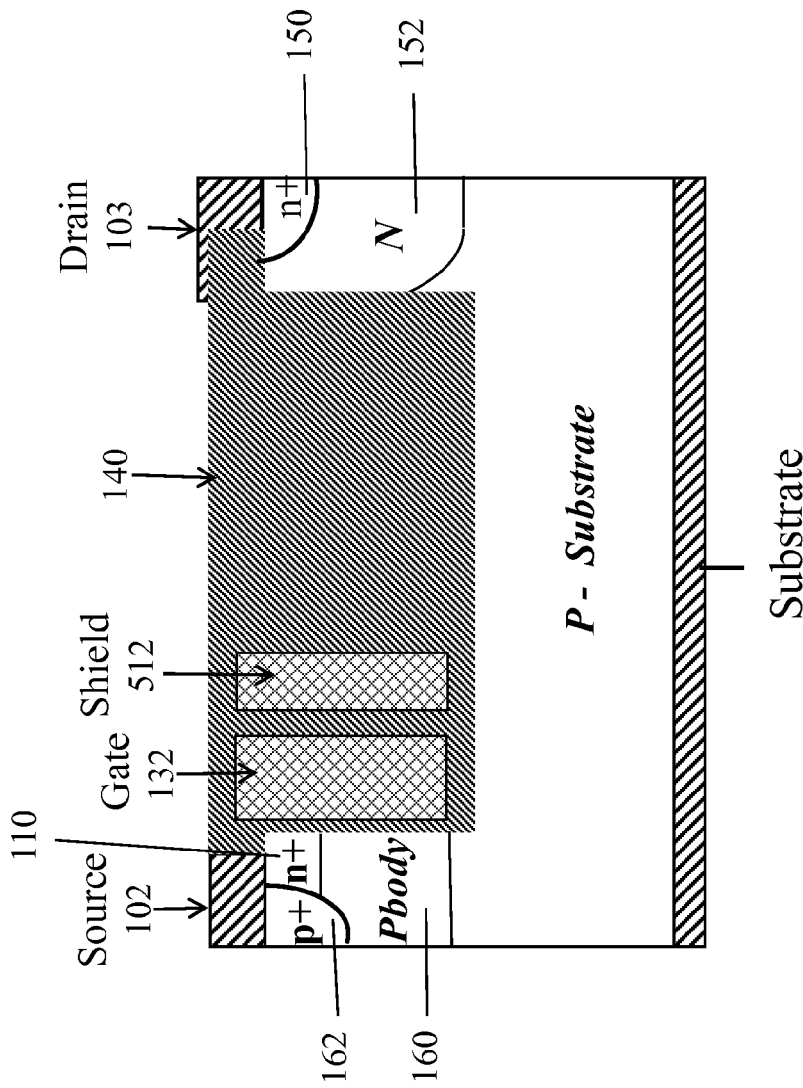
Figure 5(c): Cross section along BB using a gate trench

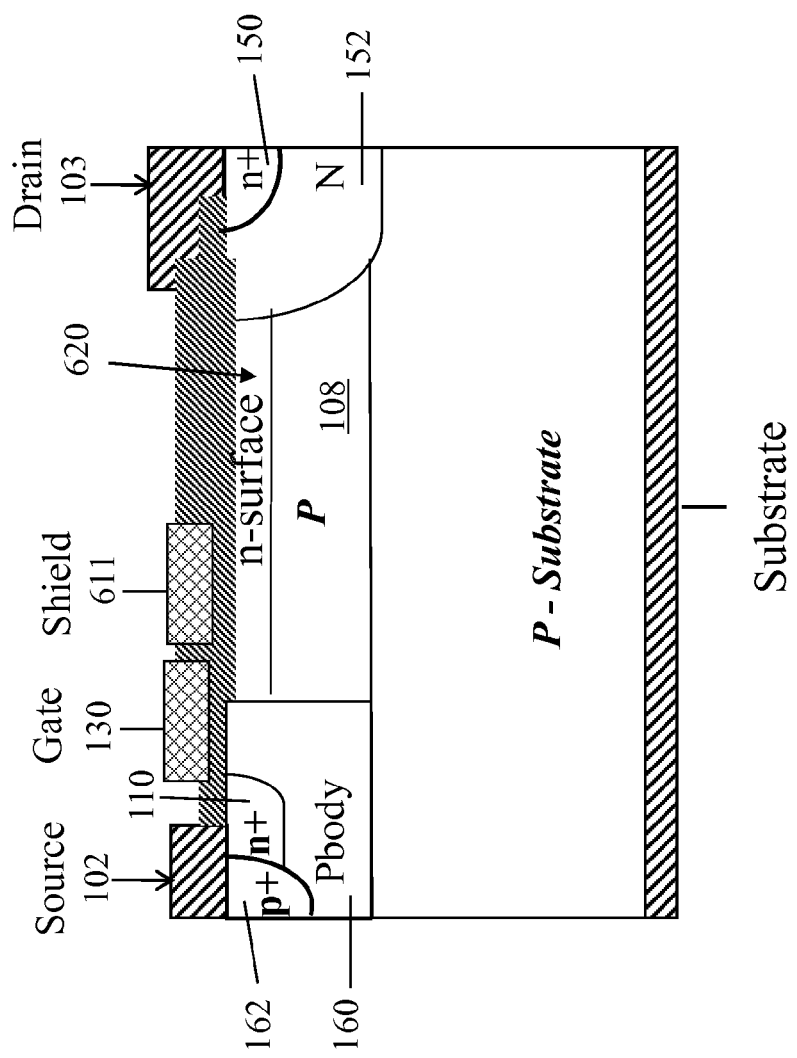
Figure 6: Another alternative cross section of a device similar to 5(b) but utilizing n-surface layer

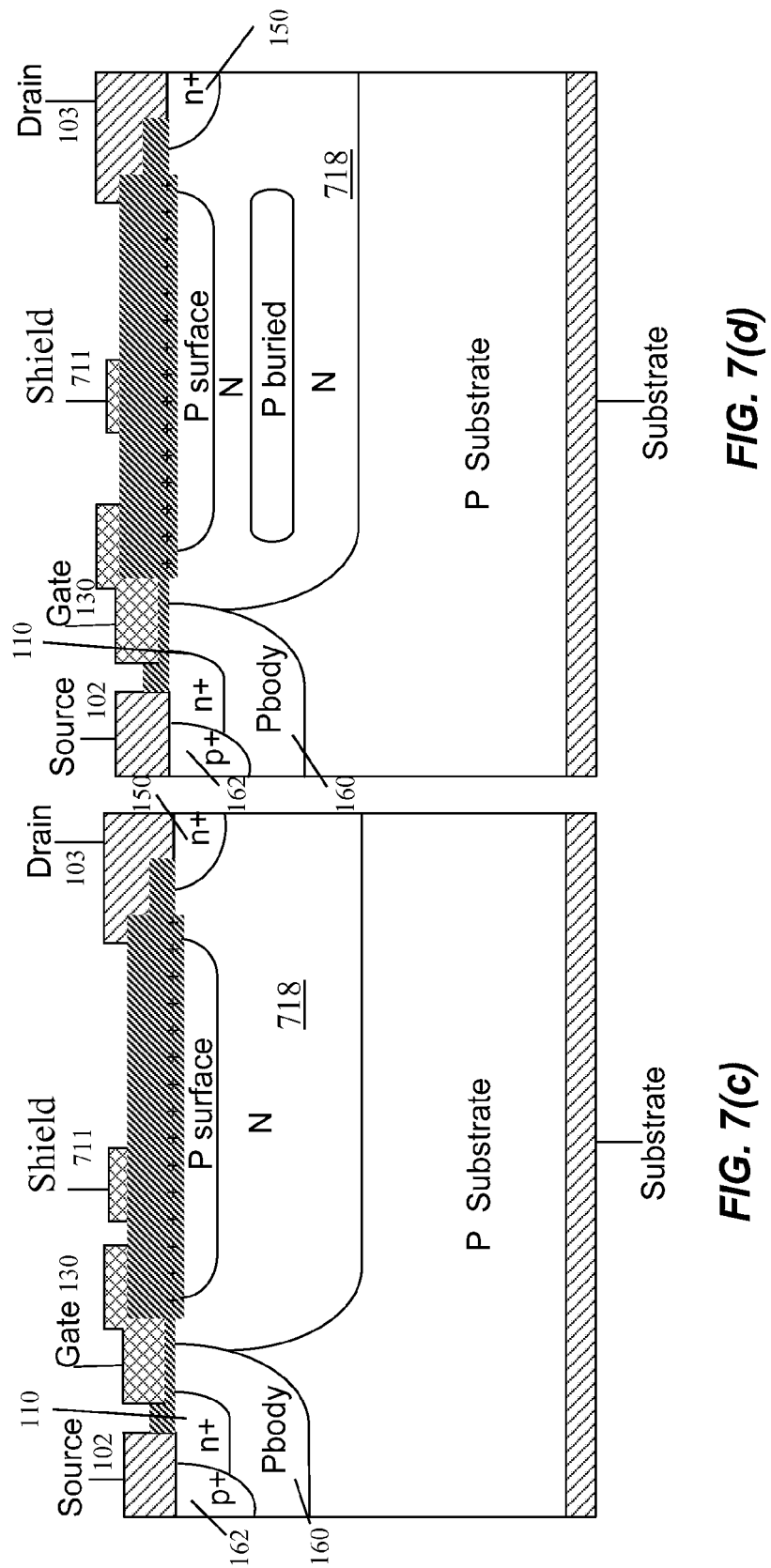

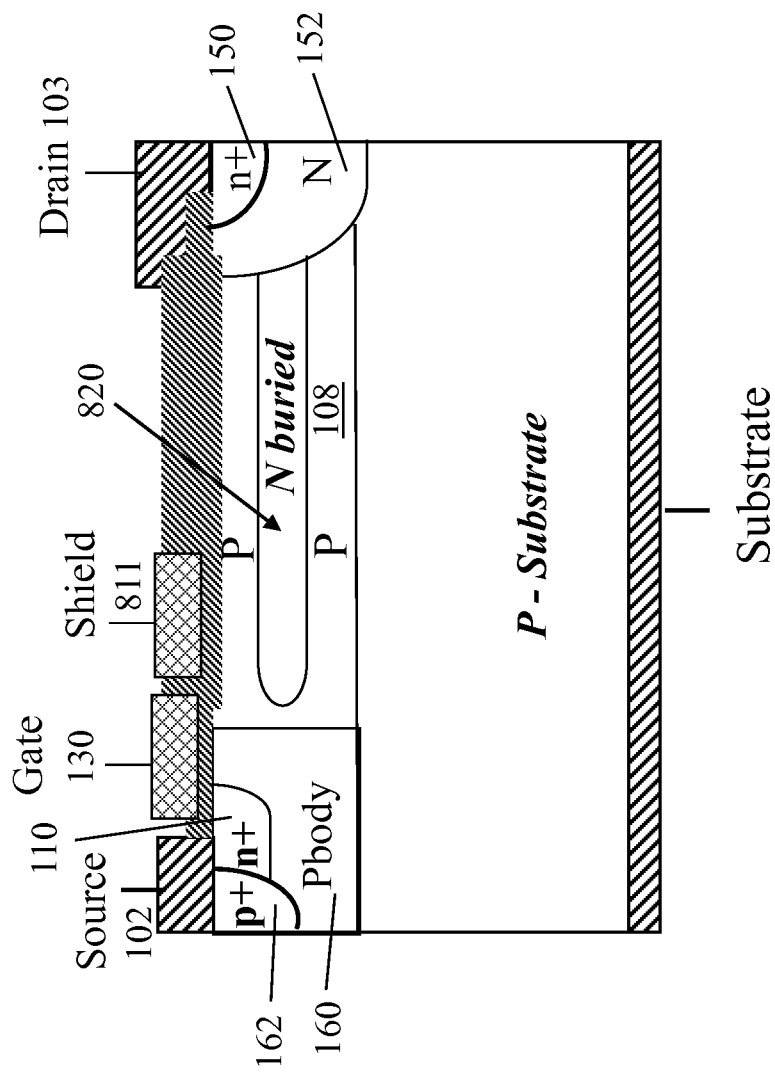
Figure 8(a) : An alternative cross section along AA of Figure 5(a)

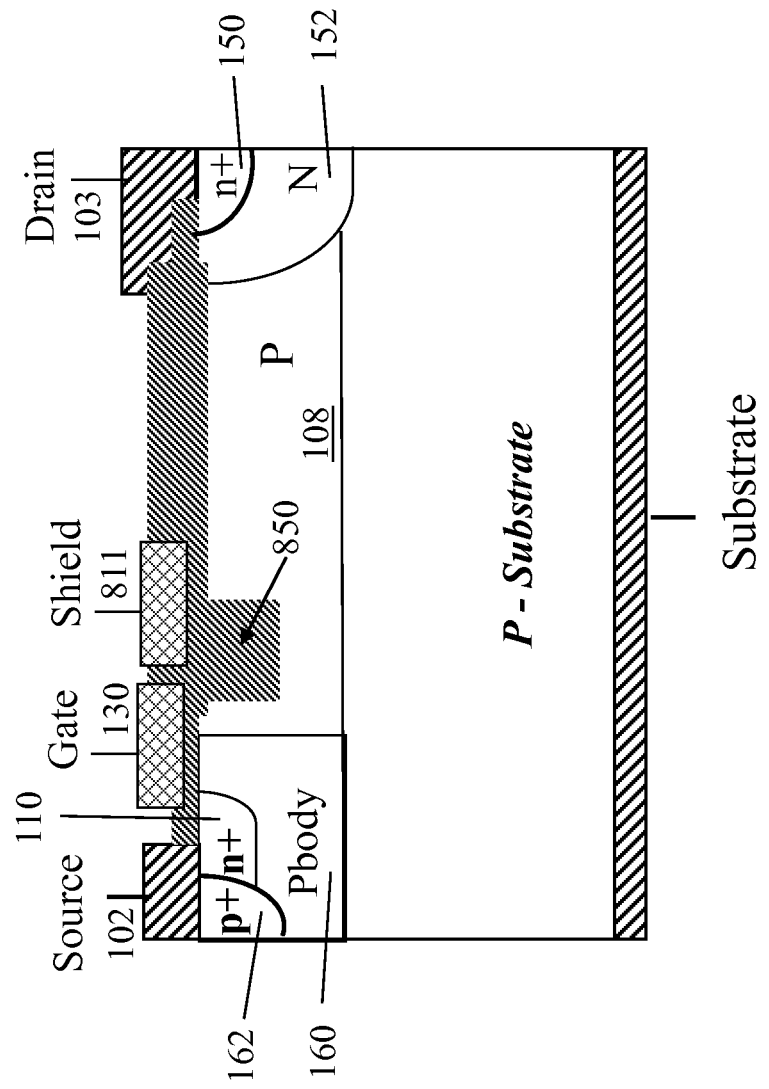
Figure 8(b) : An alternative cross section along AA of Figure 5(a)

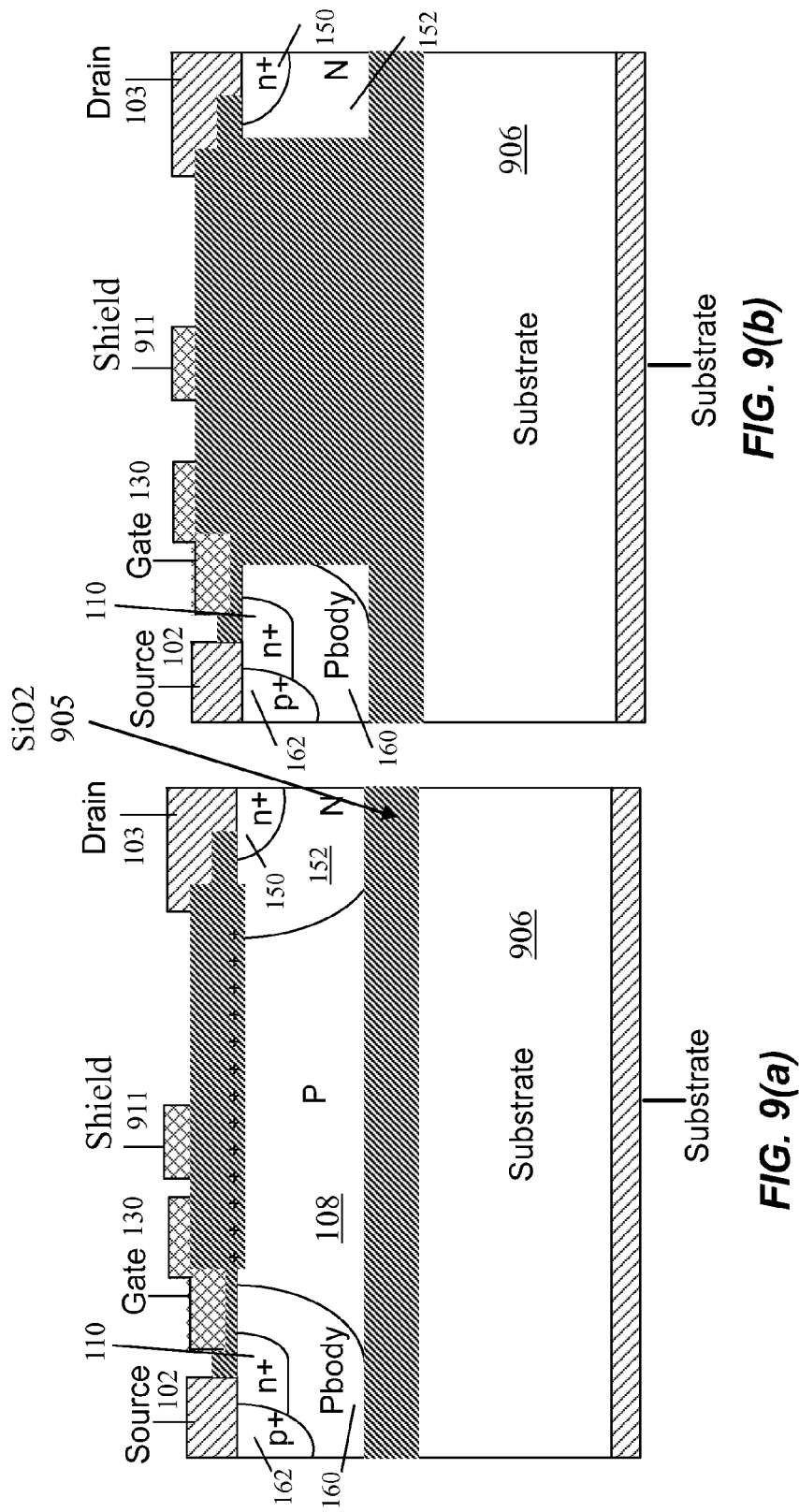

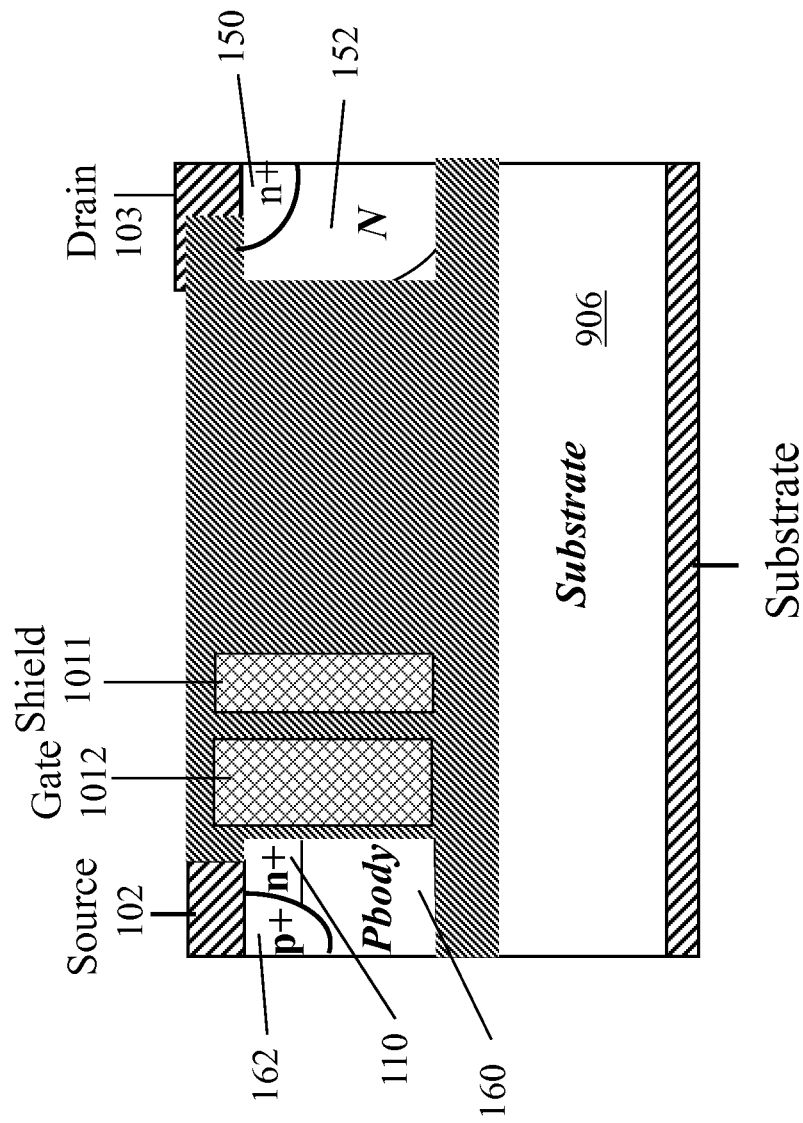
Figure 10: Another SOI version

POWER DEVICES, STRUCTURES, COMPONENTS, AND METHODS USING LATERAL DRIFT, FIXED NET CHARGE, AND SHIELD

CROSS-REFERENCE

Priority is claimed from U.S. Application 61/225,009 filed on Jul. 13, 2009.

Priority is also claimed from commonly owned copending U.S. application Ser. No. 11/971,152 filed Jan. 8, 2008 and now published as US 20080164520, and therethrough from provisional application 60/879,434 filed Jan. 9, 2007.

Priority is also claimed from commonly owned copending U.S. application Ser. No. 12/432,917, filed Apr. 30, 2009 and now published as US 2010/0025726, and therethrough from provisional application 61/084,639 filed Jul. 30, 2008.

Priority is also claimed from commonly owned copending U.S. application Ser. No. 12/431,005, filed Apr. 28, 2009 and now published as US 2010/0025763, and therethrough from provisional applications 61/084,639 and 61/084,639, both filed Jul. 30, 2008.

Each and every one of these priority applications is hereby incorporated by reference.

BACKGROUND

The present application relates to lateral power semiconductor devices, and more particularly to lateral power semiconductor devices which incorporate fixed or permanent electrostatic net charge.

Note that the points discussed below may reflect the hindsight gained from the disclosed inventions, and are not necessarily admitted to be prior art.

Power MOSFETs are widely used as switching devices in many electronic applications. In order to minimize the conduction power loss it is desirable that power MOSFETs have a low specific on-resistance ($R_{SP}$ or R*A), which is defined as the product of the on-resistance of the MOSFET multiplied by the active die area. In general, the on-resistance of a power MOSFET is dominated by the channel resistance and the drift region resistances which include the channel resistance, spreading resistance and the epitaxial layer resistance.

In the parent applications referenced above, and in many other commonly owned applications, the present inventors have proposed a variety of new vertical and lateral structures which improve on-resistance and/or breakdown characteristics by incorporating fixed or permanent charges. FIGS. 1(a)-1(c), 2(a), and 2(b) show lateral device structures disclosed in the various parent applications, but it is important to note that those structures are not prior art against the present application, since priority has been claimed back to their disclosures.

SUMMARY

The present application discloses new approaches to lateral and quasi-lateral device structures, in which a shield electrode is added into a structure which includes immobile net electrostatic charge.

The disclosed innovations, in various embodiments, provide one or more of at least the following advantages. However, not all of these advantages result from every one of the innovations disclosed, and this list of advantages does not limit the various claimed inventions.

Reduced gate-drain capacitance;
Reduced Miller charge; and
Faster switching.

BRIEF DESCRIPTION OF THE DRAWINGS

The disclosed inventions will be described with reference to the accompanying drawings, which show important sample embodiments of the invention and which are incorporated in the specification hereof by reference, wherein:

FIGS. 1(a)-1(c), 2(a), and 2(b) show lateral device structures disclosed in the various parent applications.

FIGS. 3(a)-3(c) together show a first sample embodiment of a new class of innovative structures.

FIG. 4 shows an embodiment using source metal to form the shield layer.

FIGS. 5(a)-5(c) show another sample embodiment.

FIG. 6 shows another alternative embodiment which includes a shallow surface layer, doped opposite to the body, at the surface of the drift region.

FIGS. 7(a)-7(e) show other embodiments which include an n-type drift layer, a P-type surface layer and shallow dielectric trench.

FIGS. 8(a) and 8(b) show other alternative embodiments which includes an N-buried layer within the drift region in FIG. 8(a) and a shallow trench dielectric in FIG. 8(b).

FIGS. 9(a)-9(c) show different SOI embodiments.

FIG. 10 shows another SOI embodiment using trench gate and shield.

DETAILED DESCRIPTION OF SAMPLE EMBODIMENTS

Figure 7B:
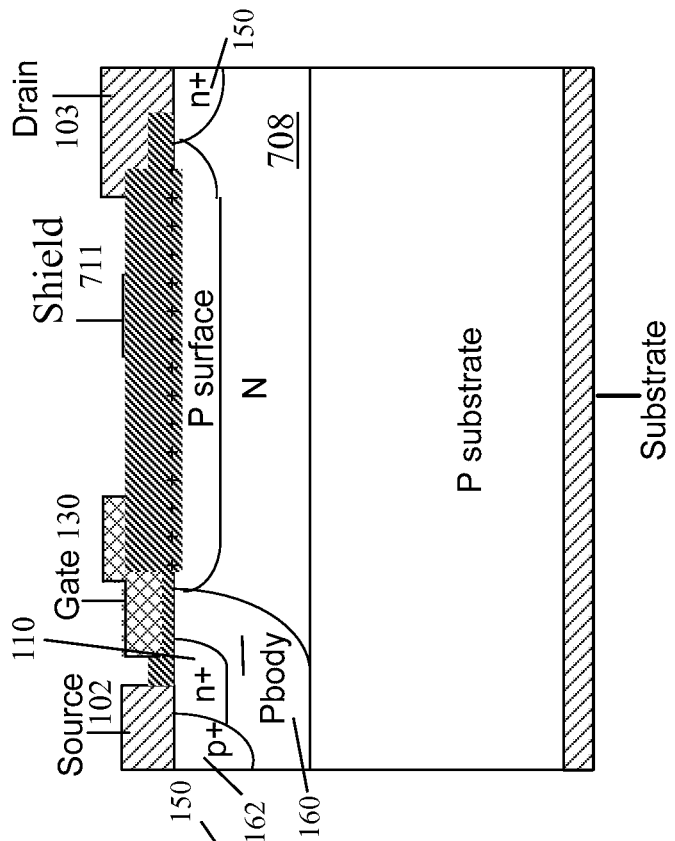

The numerous innovative teachings of the present application will be described with particular reference to presently preferred embodiments (by way of example, and not of limitation). The present application describes several inventions, and none of the statements below should be taken as limiting the claims generally.

In the device shown in FIGS. 1(a)-1(c), permanent positive electrostatic charges are incorporated in trenches 140 filled with a dielectric material such as silicon dioxide. This can be done, for example, by implanting Cesium ions into a thin layer of oxide before the trench is filled. Optionally, permanent charge can also be incorporated in the device's surface dielectric layer. The permanent charge shapes the electric field at reverse bias and results in a higher breakdown voltage. In the on-state the permanent charge forms an electron induced drift region in a power MOSFET by forming an inversion layer along the interface between the oxide and a surrounding p-type layer (e.g. a p-type epitaxial or p-well layer 108, as shown in FIGS. 1(b) and 1(c)). By making use of this new concept, a small cell pitch and high packing density can be realized to reduce the device's total on-resistance and specific on-resistance ($R_{SP}$).

Thus in normal operation of the structure of FIGS. 1(a)-1(c), a sufficiently positive voltage on gate 130 will invert a surface portion of the p-type body 160 to create a channel, and thereby permit electrons to flow from n+ source diffusion 110 through the channel to a portion of p-type epitaxial layer 108 which has been inverted by the fixed charge at a dielectric interface. These inverted portions will be referred to as induced drain extensions. The n+ drain 150 may be surrounded by a more lightly doped n-type shallow drain diffusion 152, as shown in FIG. 1(b). Metallization 102 makes contact to the source diffusion 110 and (through p+ body contact diffusion 162) to body 160. The dopant concentration of the P epi (or P well) layer 108 can be, for example, in the range of 5e14 $cm^{-3}$ to 5e17 $cm^{-3}$. The doping of the P– substrate can be in the range of 1e14 $cm^{-3}$ to 5e19 $cm^{-3}$.

FIG. 2(*a*) shows another embodiment with a different source pattern, which reduces resistance between the p+ body contact 162 and the body 160. In this embodiment the n+ source diffusion 110 is laid out as an interrupted strip rather than a continuous strip.

FIG. 2(*b*) shows another embodiment in which majority carrier flow through the channel is vertical rather than horizontal. Here the planar gate 130 has been replaced by a trench gate 132. Note that the shape of p-type body region 160 is somewhat different in this example.

An important parameter that controls the device switching power losses, is the total charge associated with charging or discharging the gate-drain capacitance Cgd. This charge is so called "Miller charge" Qgd. Therefore, it is important to reduce Qgd in order to reduce its total power losses. However, as the cell pitch reduces and the cell density increases, the associated intrinsic capacitances of the device, such as the gate-to-drain capacitance (Cgd), also increase. As a consequence, the switching power loss of the device increases.

The present application discloses several different device structures which improve the switching performance over prior art devices, and even as compared to the teachings of the parent applications. FIGS. 3(*a*), 3(*b*), and 3(*c*) show a lateral power device which is generally similar to that shown in FIGS. 1(*a*)-1(*c*), except that it has an additional conductive shield layer 311. The source metallization 102, n+ source diffusion 110, p-type body 160, p+ body contact 162, drift region 108, shallow drain 152, and deep drain 150 all function just as in the device of FIGS. 1(*a*)/1(*b*)/1(*c*). Thus the reduction in the parasitic Miller capacitance is achieved without harming device density or performance.

In this example the shield electrode 311 is coplanar with the gate electrode 130, and is preferably fabricated in the same process step.

The conductive shield electrode 311 can be floating, or (more preferably) is electrically shorted to the Source terminal. It can be formed by a polysilicon, polycide, or metal layer. As a result, the Gate electrode 130 is more electrically shielded from the drain region than in FIGS. 1(*a*)/1(*b*)/1(*c*), and the gate-to-drain capacitance Cgd is lowered. Consequently the Miller charge Qgd is lowered, which reduces switching power losses.

FIG. 4 shows another sample embodiment with the source metal layer 402 is adapted to also provide some shielding for the gate electrode. In this example, a recess 407 has been etched into the thick dielectric 405, to bring the outside edge of the source metallization down to a level which is within a "line of sight" from some portion of the gate electrode to at least some portion of the drain metallization 103. Source metal 402 thus has a shape which somewhat resembles a merger of the source metallization 102 of FIG. 1(*a*) etc. with the shield electrode 311 of FIGS. 3(*a*), 3(*b*), and 3(*c*). Many elements in this Figure are similar to those described above, and those skilled in the art will readily understand that descriptions of analogous elements in the preceding Figures apply, with appropriate adjustments, to this Figure too.

FIGS. 5(*a*)-5(*b*) show another sample embodiment, with a source layout which is slightly different from that of FIGS. 1(*a*)-1(*c*). Here too the shield electrode 511 can be floating, but more preferably is electrically shorted to the Source terminal 102. The shield electrode 511 can be formed from doped polysilicon or other conductive material. As a result, the Gate terminal 130 is electrically shielded from the drain region, and the gate-to-drain charge Qgd is lowered. This reduces switching losses. Many elements in these Figures are similar to those described above, and those skilled in the art will readily understand that descriptions of analogous elements in the preceding Figures apply, with appropriate adjustments, to these Figures too.

FIG. 5(*c*) shows an alternative embodiment which uses a trench gate 132 and a matching shield electrode 512. Note that the shield electrode 512, like the trench gate electrode 132, has a vertical cross section which is much greater than its horizontal cross section. Since the shield electrode 512 is interposed between the gate electrode and the drain, Cgd is reduced. (Coupling capacitance will be affected by fringe fields too, but interposition of an electrode into the line-of-sight does help reduce coupling capacitance.)

Preferably the shield and gate electrodes are fabricated in the same kind of process. Optionally, it is contemplated that these two electrodes can be formed in the SAME process step, e.g. as sidewall filaments on opposite faces of a trench. Many elements in this Figure are similar to those described above, and those skilled in the art will readily understand that descriptions of analogous elements in the preceding Figures apply, with appropriate adjustments, to this Figure too.

FIG. 6 shows another alternative embodiment which includes a shallow layer 620, doped opposite to the body, at the surface of the drift region 108. In this example, the device has an n-type surface region 620 between the p-type body 160 and the N+ drain 150. Here too the presence of the shield electrode 611 helps to reduce gate-drain capacitance, and hence Miller charge Qgd. Many elements in this Figure are similar to those described above, and those skilled in the art will readily understand that descriptions of analogous elements in the preceding Figures apply, with appropriate adjustments, to this Figure too.

Figure 7A:
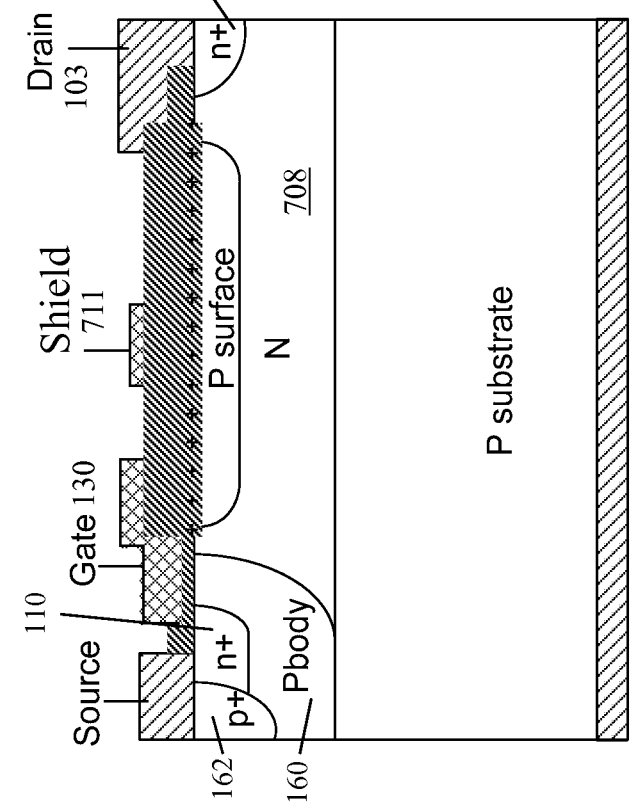
Figure 7E:
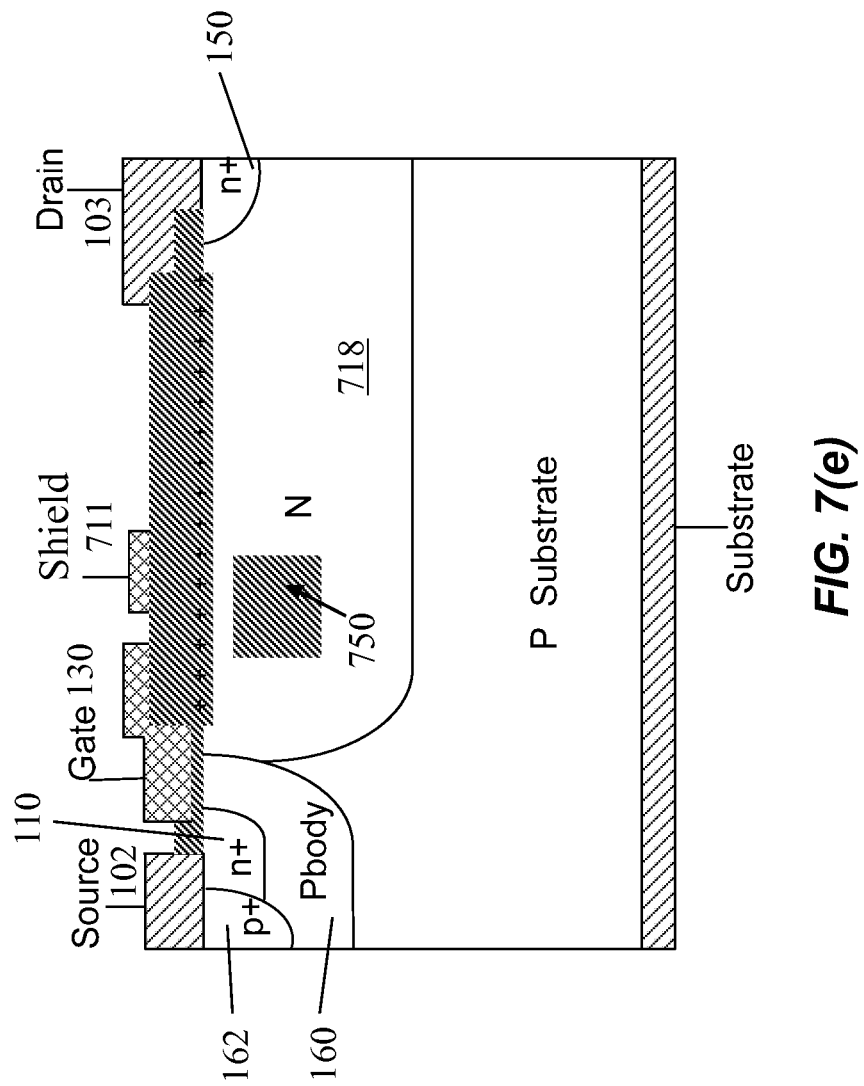

FIGS. 7(*a*)-7(*d*) show other embodiments which include an n-type drift layer and a p-type surface layer. The N-layer 708 in FIGS. 7(*a*) and 7(*b*) has uniform doping, e.g. as provided by an epitaxial layer. Many elements in this Figure are similar to those described above, and those skilled in the art will readily understand that descriptions of analogous elements in the preceding Figures apply, with appropriate adjustments, to this Figure too.

FIGS. 7(*c*) and 7(*d*) show other embodiments, in which the N-layer 718 has non-uniform doping and can be formed by diffusion. Many elements in this Figure are similar to those described above, and those skilled in the art will readily understand that descriptions of analogous elements in the preceding Figures apply, with appropriate adjustments, to this Figure too.

The embodiment in FIG. 7(*d*) includes an additional p-buried layer 719 in the drift region 718. It should be noted that one or more p-buried layers 719 can be included. It should also be noted that in FIGS. 7(*a*)-7(*d*) the presence of the shield electrode 711 helps to reduce gate-drain capacitance, and hence Miller charge Qgd. Many elements in this Figure are similar to those described above, and those skilled in the art will readily understand that descriptions of analogous elements in the preceding Figures apply, with appropriate adjustments, to this Figure too.

FIG. 7(*e*) shows yet another alternative embodiment, which is somewhat similar to the device of FIG. 3(*b*), except for the use of a diffused N-well 718 and a shallow trench 750. Trench 750 is filled with dielectric material, and preferably overlaps the gate electrode 130. This dielectric trench 750 helps to increase the physical distance between the gate electrode 130 and the majority carrier flows which pass beneath trench 750. This further reduces the gate-drain capacitance and improves the device reliability. Many elements in this Figure are similar to those described above, and those skilled in the art will readily understand that descriptions of analogous elements in the preceding Figures apply, with appropriate adjustments, to this Figure too.

FIG. 8(a) shows another alternative embodiment which is generally somewhat similar to those described above, but includes an n-type buried layer 820 within the drift region 108, between the p-type body 160 and the N+ drain 150. This buried layer 820 will help to provide charge balance under reverse-bias conditions. Here too the presence of the shield electrode 811 helps to reduce gate-drain capacitance, and hence Miller charge Qgd. Many elements in this Figure are similar to those described above, and those skilled in the art will readily understand that descriptions of analogous elements in the preceding Figures apply, with appropriate adjustments, to this Figure too.

FIG. 8(b) shows another alternative embodiment which includes a shallow trench 850 filled with dielectric material and located beneath the gate and the shield electrodes. The presence of the shallow trench 850 overlapping the gate electrode results in a further reduction in gate-drain capacitance as well as improved device reliability due to reduction of surface electric field. Many elements in this Figure are similar to those described above, and those skilled in the art will readily understand that descriptions of analogous elements in the preceding Figures apply, with appropriate adjustments, to this Figure too.

Figure 9C:
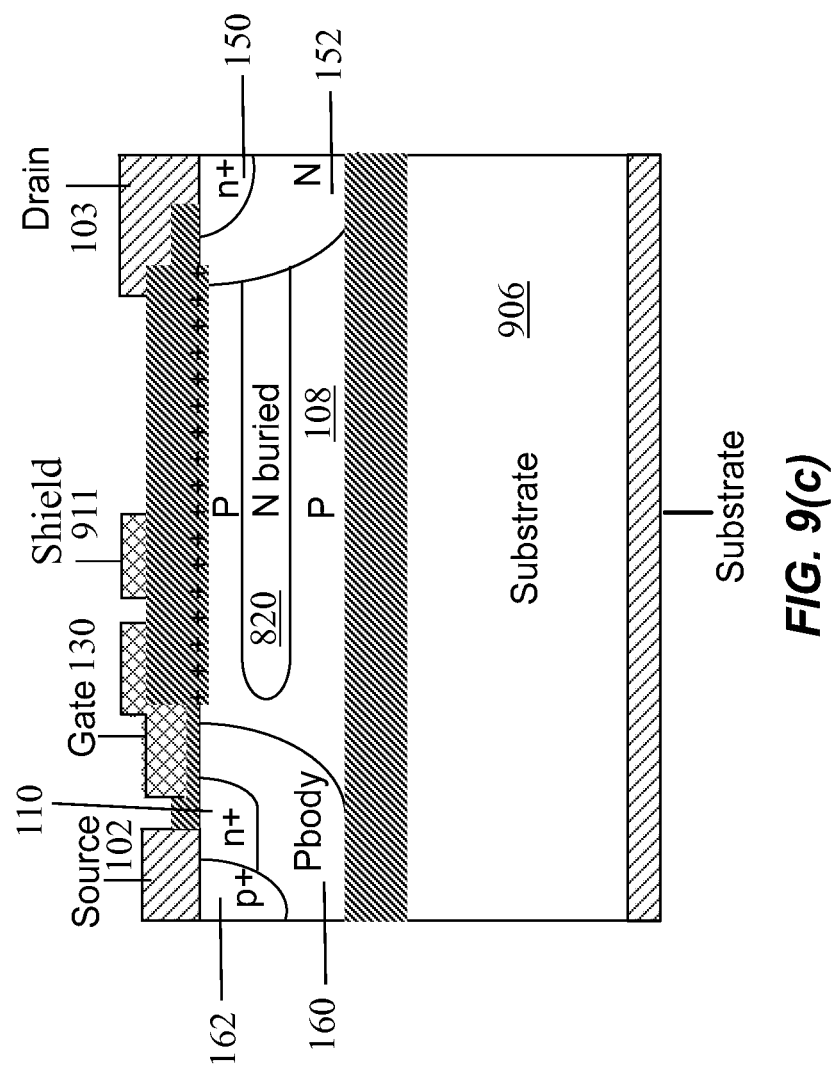

FIGS. 9(a)-9(c) show other embodiments which are built in a semiconductor-on-insulator (SOI) structure. These examples use a planar gate 130 and shield electrode 911. The gate and shield electrodes are preferably formed at the same time, in a single thin-film layer. In this example the insulated substrate 905/906 is a silicon dioxide (905) on silicon (906) structure, and the active layer 108 is preferably silicon. Here too the presence of the shield electrode 911 helps to reduce gate-drain capacitance, and hence Miller charge Qgd. Many elements in this Figure are similar to those described above, and those skilled in the art will readily understand that descriptions of analogous elements in the preceding Figures apply, with appropriate adjustments, to this Figure too.

FIG. 10 shows another SOI embodiment. Unlike the device of FIGS. 9(a)-(c), this device uses a trench gate 1012 with a matching shield electrode 1011. In either case, the gate and shield electrodes are preferably formed by the same process. Here too the presence of the shield electrode helps to reduce gate-drain capacitance, and hence Miller charge Qgd. Many elements in this Figure are similar to those described above, and those skilled in the art will readily understand that descriptions of analogous elements in the preceding Figures apply, with appropriate adjustments, to this Figure too.

Figure 11A:
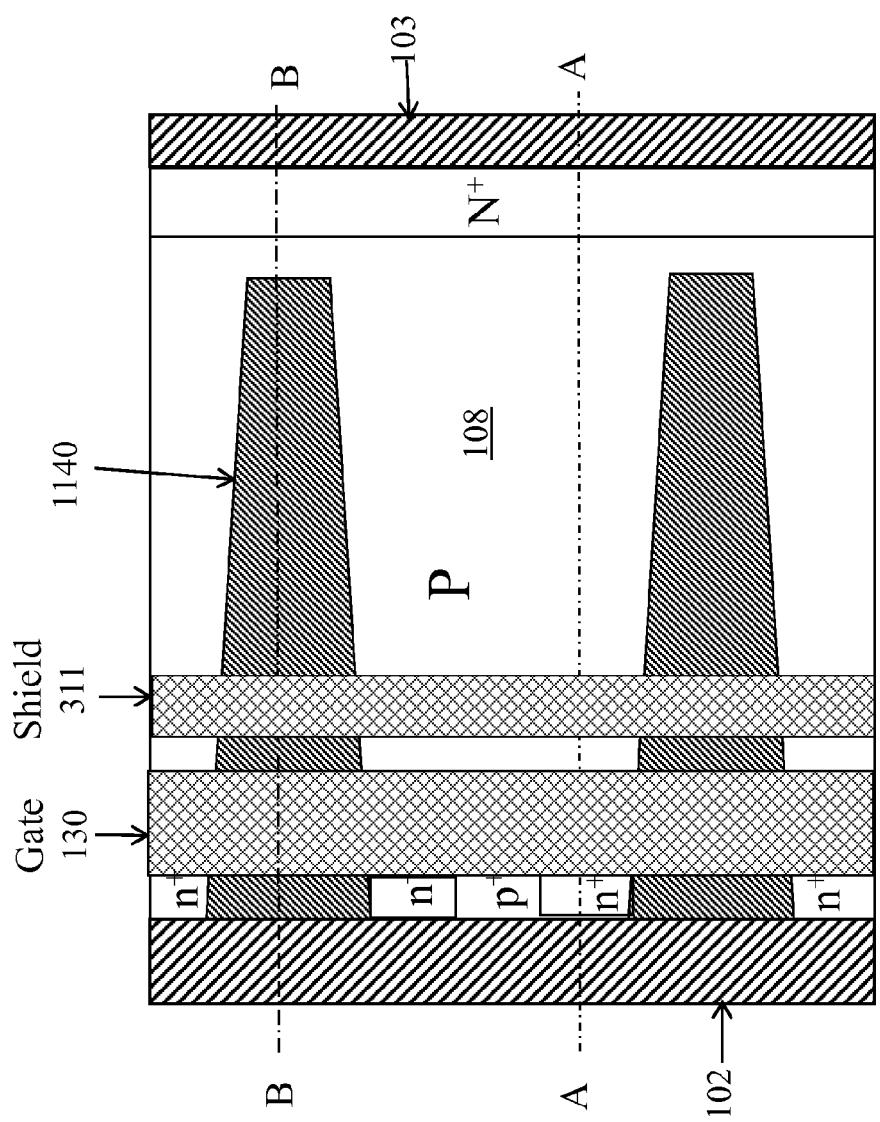
FIGS. 11(a) and 11(b) show other device embodiments, in which the dielectric-filled trenches are laterally tapered.

FIG. 11(a) shows another device embodiment, which is generally somewhat similar to that of FIG. 3(a), except that the dielectric-filled trenches 140 have been replaced by horizontally tapered dielectric-filled trenches 1140. In the top view of FIG. 11(a), it can be seen that the trench width is narrower at the drain side. For a given areal density of fixed charge along the sidewalls of the trench, this means that the charge balance ratio varies along the length of the drift region, with less charge balancing at the drain end of the trenches 1140. Here too the presence of the shield electrode helps to reduce gate-drain capacitance, and hence Miller charge Qgd. Many elements in this Figure are similar to those described above, and those skilled in the art will readily understand that descriptions of analogous elements in the preceding Figures apply, with appropriate adjustments, to this Figure too.

Figure 11B:
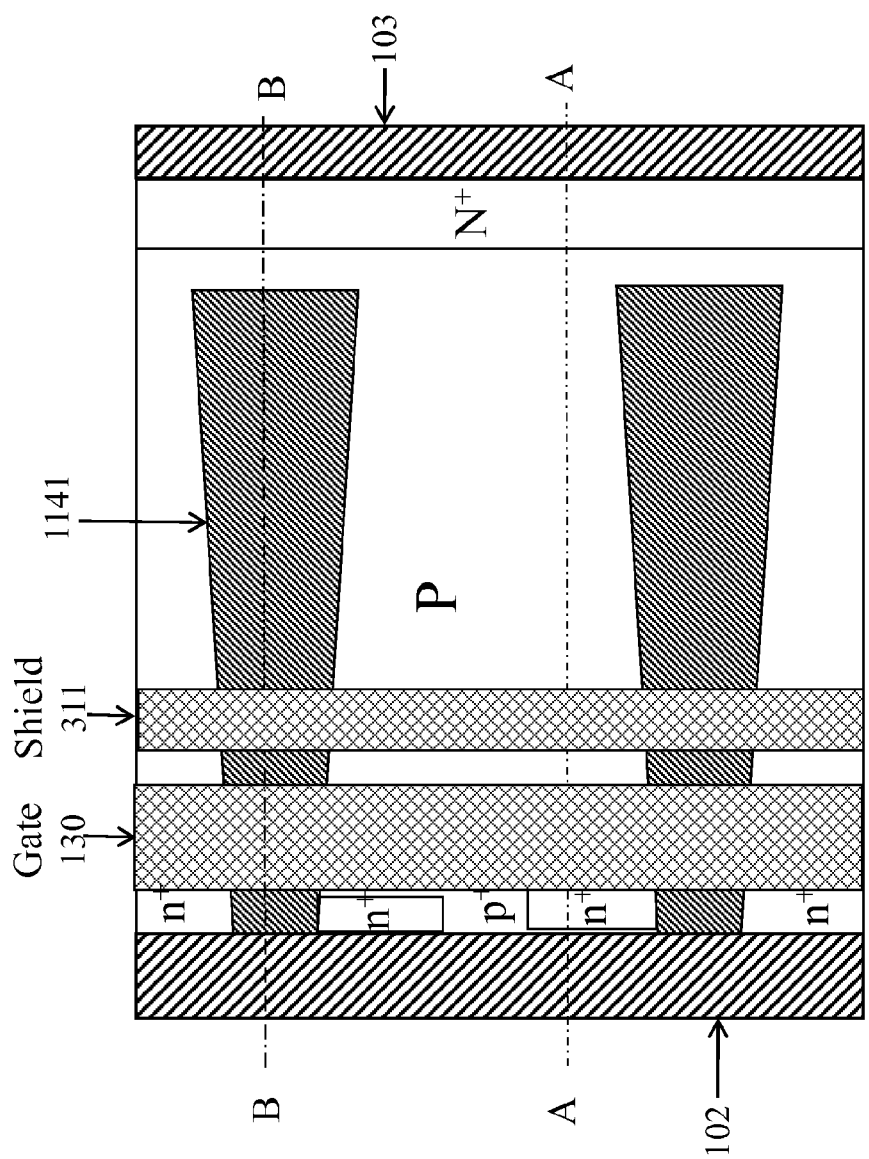

FIG. 11(b) is a top view of another lateral device structure, which is generally similar to that of FIG. 11(a), except that the trenches 1140 have been replaced by trenches 1141 which have an opposite direction of taper: trenches 1141 are wider at their drain end. For a given areal density of fixed charge along the sidewalls of the trench, this means that the charge balance ratio varies along the length of the drift region, with less charge balancing at the source end of the trenches 1140. Here too the presence of the shield electrode helps to reduce gate-drain capacitance, and hence Miller charge Qgd. Many elements in this Figure are similar to those described above, and those skilled in the art will readily understand that descriptions of analogous elements in the preceding Figures apply, with appropriate adjustments, to this Figure too.

Additionally, further improvement in Qgd can be obtained by reducing the fringing capacitance in the transition region between the gate and the Shield Layer. This is realized by controlling the oxide thickness in the transition zone.

The doping levels needed to achieve high breakdown and low-resistance are governed by the well known charge balance condition. The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

According to some, but not necessarily all disclosed inventive embodiments, there is provided: A semiconductor device comprising: a first-conductivity-type source region; a second-conductivity-type body region interposed between said source region and a semiconductor drift region; a gate electrode which is capacitively coupled to controllably invert a portion of said body region, to controllably form therein a channel which connects said source region to said drift region; wherein said drift region is laterally interposed between said body region and a first-conductivity-type drain region; permanent charge, embedded in at least one insulating region which vertically adjoins said drift region, which has a polarity which tends to deplete a layer of said drift region in proximity to said insulating region; and a shield electrode, which is at least partly interposed between said gate electrode and said drain to reduce capacitive coupling between said gate and said drain.

According to some, but not necessarily all disclosed inventive embodiments, there is provided: A semiconductor device comprising: a first-conductivity-type source region; a second-conductivity-type body region interposed between said source region and a semiconductor drift region of said second conductivity type; a gate electrode which is capacitively coupled to controllably invert a portion of said body region, to controllably form therein a channel which connects said source region to said drift region; wherein said semiconductor drift region is laterally interposed between said body region and a first-conductivity-type drain region; immobile positive net electrostatic charge, capacitively coupled to said drift region to expel holes from a continuous portion of said drift region which extends from said channel to a drain diffusion; and a shield electrode, which is at least partly interposed between said gate electrode and said drain to reduce capacitive coupling between said gate and said drain.

According to some, but not necessarily all disclosed inventive embodiments, there is provided: A method of operating a semiconductor device, comprising: in the ON state, applying a voltage to an insulated gate to thereby invert a portion of a second-conductivity-type body region interposed between a first-conductivity-type region and a second-conductivity-type drift region, and thereby allow passage of majority carriers from said source region through said channel, and through a portion of said drift region which has been inverted by immobile permanent net electrostatic charge, to a first-conductivity-type drain region; and in the OFF state, balancing the space charge of depleted portions of said drift region with said net electrostatic charge; and reducing capacitive coupling by a shield electrode which is interposed between said gate electrode and said drain.

According to some, but not necessarily all disclosed inventive embodiments, there is provided: Lateral power devices where immobile electrostatic charge is emplaced in dielectric material adjoining the drift region. A shield gate is interposed between the gate electrode and the drain, to reduce the Miller charge. In some embodiments the gate electrode is a trench gate, and in such cases the shield electrode too is preferably vertically extended.

According to some, but not necessarily all disclosed inventive embodiments, there is provided: A semiconductor device comprising: a first-conductivity-type source region; a second-conductivity-type body region interposed between said source region and a semiconductor drift region of said second conductivity type; a gate electrode which is capacitively coupled to controllably invert a portion of said body region, to controllably form therein a channel which connects said source region to said drift region; wherein said semiconductor drift region is laterally interposed between said body region and a first-conductivity-type drain region; and an insulated trench which laterally adjoins said drift region, and which contains immobile net electrostatic charge which is capacitively coupled to said drift region, and which is laterally tapered.

According to some, but not necessarily all disclosed inventive embodiments, there is provided: A semiconductor device comprising: a first-conductivity-type source region; a second-conductivity-type body region interposed between said source region and a semiconductor drift region; and a gate electrode which is capacitively coupled to controllably invert a portion of said body region, to controllably form therein a channel which connects said source region to said drift region; wherein said drift region is laterally interposed between said body region and a first-conductivity-type drain region; permanent charge, which is embedded in at least one insulating region which adjoins said drift region, and which has a polarity which tends to deplete a layer of said drift region in proximity to said insulating region; a shield electrode, which is at least partly interposed between said gate electrode and said drain to reduce capacitive coupling between said gate and said drain; and a dielectric-filled trench within said drift region, which lies at least partly beneath said gate electrode.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

While the figures shown in this disclosure are qualitatively correct, the geometries used in practice may differ and should not be considered a limitation in anyway. It is understood by those of ordinary skill in the art that the actual cell layout will vary depending on the specifics of the implementation and any depictions illustrated herein should not be considered a limitation in any way.

While only n-channel MOSFETs are shown here, p-channel MOSFETs are realizable with this invention simply by changing the polarity of the permanent charge and swapping n-type and p-type regions in any of the figures. This is well known by those of ordinary skill in the art.

This invention is also applicable to the case of corresponding structures that use negative permanent charge and replacing the P region between the p-body and drain regions with an N-region. Permanent negative charge can be created for example by using different dielectric layers such as silicon dioxide and Aluminum Oxide.

It is understood that the permanent charge can be in the dielectric (oxide), at the interface between the silicon and oxide, inside the silicon layer or a combination of all these cases.

It is also understood that numerous combinations of the above embodiments can be realized.

It is understood by those of ordinary skill in the art that other variations to the above embodiments can be realized using other known termination techniques.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A semiconductor device comprising:
    a first-conductivity-type source region;
    a second-conductivity-type body region interposed between said source region and a semiconductor drift region;
    a gate electrode which is capacitively coupled to controllably invert a portion of said body region, to controllably form therein a channel which connects said source region to said drift region;
    wherein said drift region is laterally interposed between said body region and a first-conductivity-type drain region;
    permanent charge, which is embedded in at least one insulating region which adjoins said drift region, and which has a polarity which tends to deplete a layer of said drift region in proximity to said insulating region;
    a shield electrode, which is at least partly interposed between said gate electrode and said drain to reduce capacitive coupling between said gate and said drain; and
    a dielectric-filled trench within said drift region, which lies at least partly beneath said gate electrode;
    wherein said drift region is formed as a well.

2. The semiconductor device of claim 1, further comprising a buried region within said drift region.

3. The semiconductor device of claim 1, wherein said channel and said drift region both carry current flow in a predominantly horizontal plane.

4. The semiconductor device of claim 1, wherein said channel lies in a plane which is predominantly normal to the plane of current flow in said drift region.

5. The semiconductor device of claim 1, wherein said channel lies in a plane which is predominantly normal to the surface of a semiconductor die, and said drift region carries current flow which is predominantly parallel to said surface.

6. The semiconductor device of claim 1, wherein said gate electrode and said shield electrode are both predominantly planar.

7. The semiconductor device of claim 1, wherein said gate electrode and said shield electrode both have a minimum width which is less than a respective maximum vertical thickness thereof.

8. The semiconductor device of claim 1, wherein said gate electrode and said shield electrode both lie in the same plane of metallization.

9. The semiconductor device of claim 1, wherein said shield electrode is connected to a fixed potential, but said gate electrode is not.

10. The semiconductor device of claim 1, wherein said drift region is part of a semiconductor-on-insulator structure.

11. A semiconductor device comprising:
a first-conductivity-type source region;
a second-conductivity-type body region interposed between said source region and a semiconductor drift region of said second conductivity type;
a gate electrode which is capacitively coupled to controllably invert a portion of said body region, to controllably form therein a channel which connects said source region to said drift region; wherein said semiconductor drift region is laterally interposed between said body region and a first-conductivity-type drain region; and
an insulated trench
which laterally adjoins said drift region, and
which contains immobile net electrostatic charge which is capacitively coupled to said drift region, and
which is laterally tapered.

12. The semiconductor device of claim 11, wherein said charge is positive, and said first conductivity type is n-type.

13. The semiconductor device of claim 11, further comprising a shield electrode which is not electrically connected to said gate electrode, and which at least partially overlies said drift region.

14. The semiconductor device of claim 11, wherein said insulated trench is wider near said drain region than near said source region.

15. The semiconductor device of claim 11, wherein said insulated trench is wider near said source region than near said drain region.

16. The semiconductor device of claim 11, wherein said first conductivity type is n-type.

* * * * *